United States Patent
Shim et al.

(10) Patent No.: US 6,683,377 B1
(45) Date of Patent: Jan. 27, 2004

(54) MULTI-STACKED MEMORY PACKAGE

(75) Inventors: Il Kwon Shim, Singapore (SG); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 61 days.

(21) Appl. No.: 09/583,183

(22) Filed: May 30, 2000

(51) Int. Cl.⁷ .............................................. H01L 23/34
(52) U.S. Cl. ...................... 257/723; 257/723; 257/724; 438/108; 438/109; 361/749
(58) Field of Search ......................... 257/723, 724–781; 438/108, 109; 361/749

(56) References Cited

U.S. PATENT DOCUMENTS

| | | | |
|---|---|---|---|
| 5,243,497 A | * 9/1993 | Chiu | 361/783 |
| 5,646,446 A | * 7/1997 | Nicewarner, Jr. et al. | 257/723 |
| 5,674,785 A | * 10/1997 | Akram et al. | 438/15 |
| 5,811,879 A | * 9/1998 | Akram | 257/723 |
| 5,818,698 A | * 10/1998 | Corisis | 361/760 |
| 5,854,740 A | * 12/1998 | Cha | 361/760 |
| 5,998,860 A | * 12/1999 | Chan et al. | 257/679 |
| 6,061,245 A | * 5/2000 | Ingraham et al. | 361/749 |
| 6,121,676 A | * 9/2000 | Solberg | 257/686 |
| 6,208,521 B1 | * 3/2001 | Nakatsuka | 361/749 |
| 6,225,688 B1 | * 5/2001 | Kim et al. | 257/686 |
| 6,271,586 B1 | * 8/2001 | Shen | 257/723 |

FOREIGN PATENT DOCUMENTS

| JP | 10242379 A | * 9/1998 |
|---|---|---|
| JP | 2000088921 A | * 3/2000 |

OTHER PUBLICATIONS

Joseph C. Fjelstad, *Chip Scale Review*(Jan.–Feb. 2001), Tutorial: An Overview of Flexible Printed Circuit Technology, [ChipScaleReview.com], pp. 1–9.

* cited by examiner

*Primary Examiner*—Eddie Lee
*Assistant Examiner*—Chris C. Chu
(74) *Attorney, Agent, or Firm*—Bever, Hoffman & Harms, LLP; James E. Parsons, Esq.

(57) ABSTRACT

A multiple chip package and method of making the package allow multiple same size or different size chips to be stacked over each other, thereby creating a thin profile multi-chip package. Chips are attached to one surface of a continuous flexible substrate. The substrate has a metallization layer, which is electrically connected to the chips, such as via bond wires attached to center bond pads of the chips and to bond fingers on the metallization layer. Interconnections, such as solder balls, are attached to the other surface of the substrate and only at the portion opposite to the first chip. The substrate is folded to bring the first chip toward a second chip, which are then attached, such as with an insulative adhesive spacer. If any additional chips remain on the substrate, the substrate is folded to sequentially bring each additional chip toward the surface of the substrate opposite to the preceding chip and is secured thereto.

19 Claims, 5 Drawing Sheets

MULTI-STACKED MEMORY PACKAGE

BACKGROUND OF THE INVENTION

1. Field of the Invention

The present invention relates to semiconductor chip packaging, and, in particular, to stacked multiple chip packages.

2. Discussion of the Related Art

Semiconductor die or chip packages are used to protect the semiconductor device (e.g., an integrated circuit chip) and allow the chip to be electrically connected to external circuitry. The chip typically has a surface containing active circuit elements that can be accessed via conductors on the chip, such as bonding pads. The chip can be packaged using numerous packaging techniques, as is known in the art. A typical method includes the following sequence of steps:

1. Attach the chip to a package, such as by depositing die attach epoxy on the chip pad of a lead frame contained within a lead frame tape, compressing the chip into the epoxy and lead frame, and curing the epoxy;
2. Attach bond wires between the bonding pads on the chip and lead fingers on the lead frame;
3. Place the lead frame tape within a mold, and inject a plastic packaging compound into the mold to encapsulate the chip and a portion of the lead frame;
4. Separate the leads from the lead frame tape; and
5. Trim and form the leads.

The package can then be placed into a printed circuit board to access the circuitry on the IC chip.

Due to size limitations of the printed circuit board (PCB), only a finite number of packaged chips can be placed on the PCB. As the complexity of applications increases, a greater number of chips are needed on the PCB to implement the necessary functions, which would require larger size PCBs. However, it is also desirable to decrease the size of PCBs and devices containing PCBs. One method of achieving both these objectives is to increase the number of chips in a package, such as by stacking the chips, without increasing the planar area of the package. For example, an adhesive insulative film layer secures the upper surface of a first chip to the lower surface of a lead frame, where the upper surface of the first chip contains bond pads. An adhesive insulative film layer also secures the lower surface of a second chip to the upper surface of the lead frame, where the second chip is smaller than the first chip. The bond pads for both chips are interconnected via bond wires and connected to leads on the lead frame. One disadvantage to this method is that the same size chip cannot be used.

Accordingly, it is desirable to package multiple same size chips, while minimizing the size of the package.

SUMMARY OF THE INVENTION

In accordance with the present invention, a chip or die package and method of forming the package are disclosed that allows multiple same-sized dice or chips to be stacked in a single package. In one embodiment, two or more chips with center bond pads are secured to a substrate sheet or strip. Bond wires emanating from the center bond pads extend down through the substrate and are connected to a metallization layer. Solder balls or other conductive means are in contact with a portion of the metallization layer underneath one chip. All other chip or chips are "folded" on top of the one chip, resulting in a package of chips, with each chip stacked upon another. Each chip is separated from another by at least an insulative spacer.

In another embodiment, two chips are formed on opposite sides of a flexible substrate at different portions of the substrate. Bond wires from both chips extend through the substrate to connect each chip with an opposite metallization layer. Solder balls or other conductive means are formed on the metallization layer opposite one chip. The substrate is then bent away from the solder balls until the chips are coupled via an adhesive spacer and a portion of the substrate. The two chips, which can be the same size, approximately overlie each other in the resulting package.

This invention will be more fully understood in light of the following detailed description taken together with the accompanying drawings.

BRIEF DESCRIPTION OF THE DRAWINGS

Use of the same reference numbers in different figures indicates similar or like elements.

DETAILED DESCRIPTION

Figure 1A:
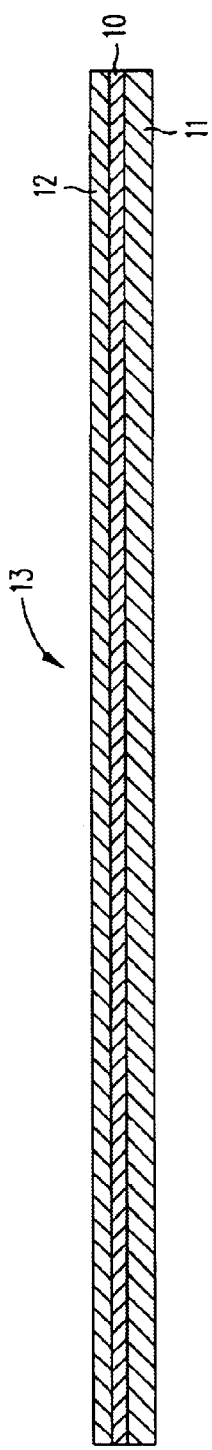
FIGS. 1A–1G are cross-sectional side views, showing steps for forming a stacked multiple chip package according to one embodiment of the present invention.

FIGS. 1A–1G are cross-sectional side views, showing the steps for forming a stacked multiple-die package 100 according to one embodiment of the present invention. As shown in FIG. 1A, a flexible insulating polyimide layer 10 is formed on a core layer 11. Other types of flexible layers can also be used, such as a polymeric film, a BT laminate film, a PPE laminate film, an epoxy laminate film, a metal layer, or a combination of such films or layers. Thereafter, a conductive thin film, such as a thin copper film 12, is formed on polyimide layer 10 through a sputtering process or an adhesion process, with the adhesion process using an adhesive layer, thus forming a raw substrate sheet 13. Sheet 13, for example, is approximately 30 to 150 μm thick.

Figure 1B:
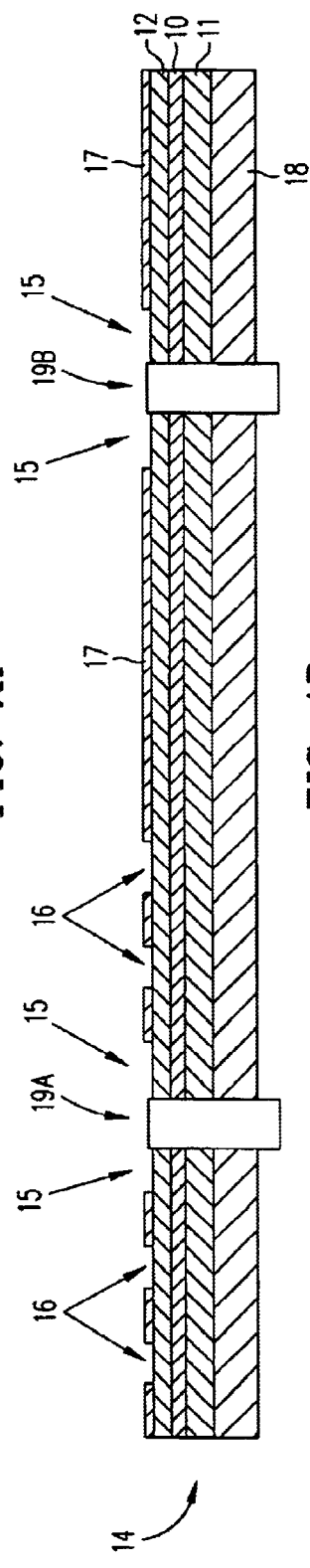

Thereafter, a substrate preparation step is performed so as to provide a desired substrate 14 as shown in FIG. 1B. In this step, copper film 12 is patterned through conventional photo masking and etching processes, thus forming substrate 14 having a circuit pattern on the patterned metallization layer. Copper film 12 is also patterned to form bond fingers 15 overlying portions of substrate 14 at which chips or dice are to be attached and to form solder ball lands 16 overlying one portion of substrate 14 at which a first chip or die will be attached. An insulating layer 17, made of a conventional insulating material, such as an epoxy solder mask, is formed on copper film 12, except where bond fingers 15 and solder ball lands 16 are located. Insulating layer 17 can be, for example, approximately 10 to 30 μm thick. An adhesive layer 18, which can be approximately 25 to 100 μm thick, is formed on the bottom surface of substrate 14, i.e., on core layer 11. The resulting substrate can be, for example, approximately 65 to 280 μm thick.

One method of forming adhesive layer 18 is to roll an adhesive layer onto the bottom surface of substrate 14 and then feed the substrate between two rollers. The rollers apply pressure and/or heat to adhesive layer 18 and substrate 14 for an amount of time determined by the selected speed of the rollers. Adhesive layer 18 is cured as a result of the application of pressure and/or heat and is thereby permanently attached to the bottom surface of substrate 14. Such a method is described in commonly-owned U.S. Pat. application Ser. No. 09/449,070, entitled METHOD OF ATTACHING A SHEET OF AN ADHESIVE FILM TO A SUBSTRATE IN THE COURSE OF MAKING INTEGRATED CIRCUIT PACKAGES, filed Nov. 23, 1999, now abandoned, which is incorporated by reference in its entirety.

Strip-shaped openings 19A and 19B are formed through substrate 14 at positions corresponding to the signal input/output pads of chips to be attached to substrate 14. Openings 19A and 199B may be formed by a punch that punches an array of openings through the joined adhesive layer 18 and substrate 14. The openings may be formed one at a time, or a plurality of openings may be formed in each motion of a multi-head punch. The first chip will be attached to the portion of substrate 14 underneath opening 19A, and the second chip will be attached to the portion of substrate 14 underneath 19B. Thus, two bond fingers 15 are formed along opposite axial edges of openings 19A and 19B, and a plurality of solder ball lands 16 are formed only at a position outside the two bond fingers 15 that will be used to connect the first chip, i.e., around opening 19A. In order to allow a plurality of conductive bond wires to be effectively and firmly bonded to bond fingers 15, bond fingers 15 may be preferably plated with gold (Au) or silver (Ag). In addition, it is preferable to plate the top surface of each solder ball land 16 with gold (Au) and/or nickel (Ni). This allows the solder balls to be effectively and firmly welded to lands 16.

Figure 1C:
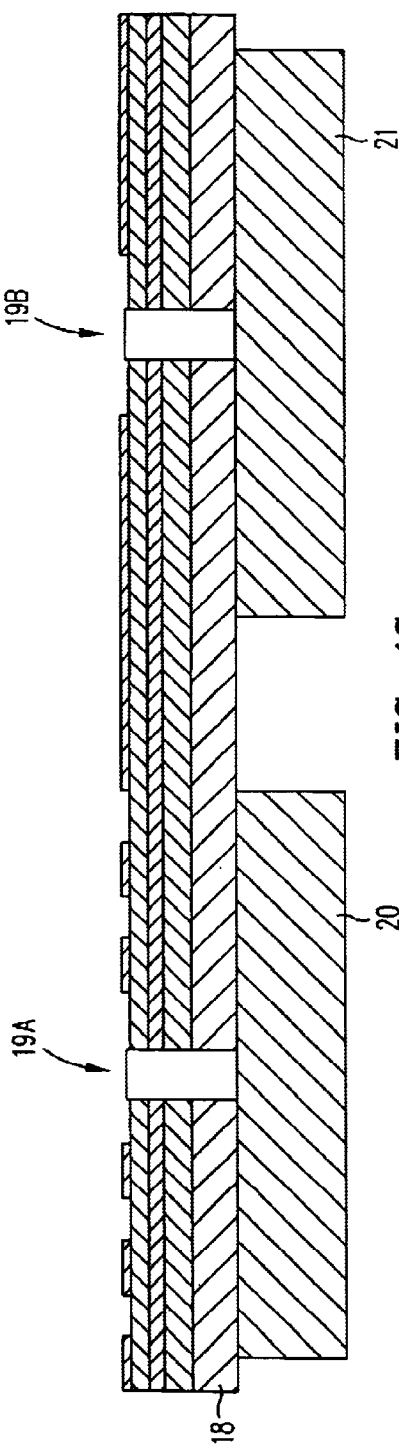
Figure 1D:
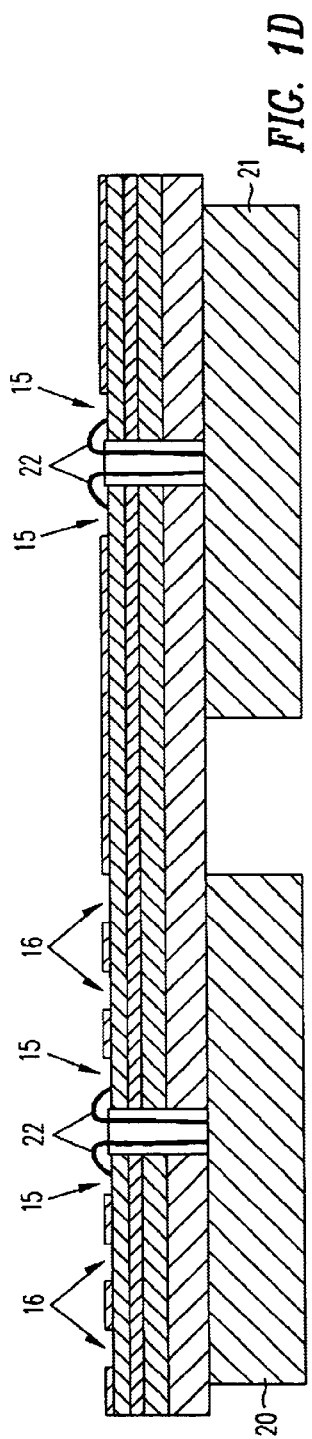

Thereafter, a chip mounting step is performed, as shown in FIG. 1C. In this step, the top surface of a first semiconductor chip 20 is attached to the lower surface of adhesive layer 18 underneath opening 19A, and a second semiconductor chip 21 is attached to the lower surface of adhesive layer 18 underneath opening 19B. First and second chips 20 and 21, which can be approximately the same size or different sizes, have center bond pads that are exposed through first and second openings 19A and 19B, respectively. After the chip mounting step, a wire bonding step is performed as shown in FIG. 1D. In the wire bonding step, the center bond pads of each chip 20 and 21 are electrically connected to bond fingers 15 through a wire bonding process using conductive bond wires 22, such as thin gold or aluminum wires.

Figure 1E:
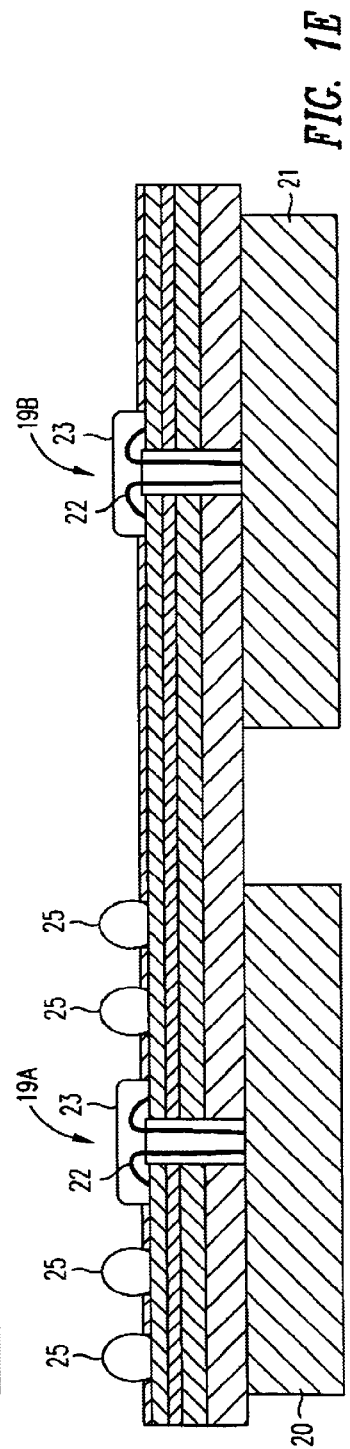
Figure 1F:
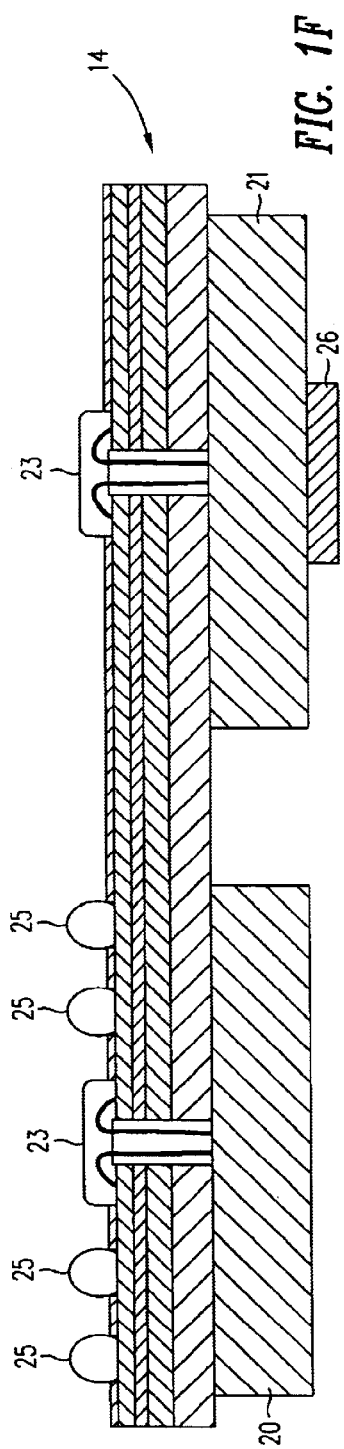
Figure 1G:
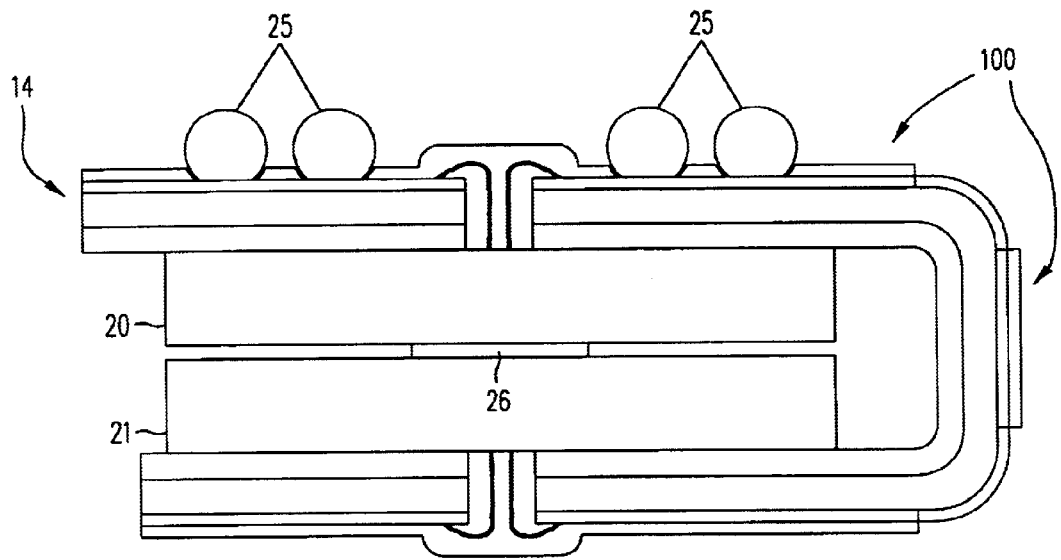

In FIG. 1E, bond wires 22 and openings 19A and 19B are encapsulated through a molding process. An encapsulant 23 protects bond fingers 15, conductive bond wires 22, and the chip center bond pads from atmospheric environment. Encapsulant may be formed of a liquid package material or a transfer molding package material, as is known to those skilled in the art. Thereafter, as also shown in FIG. 1E, conductive solder balls 25 are seated on each solder ball land 16 overlying first chip 20 prior to being heated in a high temperature heat treating device, such as an oven or a furnace. Solder balls 25 are welded to solder ball lands 16. Those skilled in the art will appreciate that other types of interconnections, such as a flip chip or wire or lead bond (e.g., micro ball grid array type), are also suitable for use in the present invention. An adhesive spacer 26 is then attached to the bottom surface second chip 21, as shown in FIG. 1F. It should be noted that adhesive spacer 26 can be attached to either first chip 20 or second chip 21.

Substrate 14 is next folded to bring first chip 20 and second chip 21 together, thereby securing first chip 20 to second chip 21 via adhesive spacer 26. This process can be performed with different sequences of steps. For example, referring to FIG. 1F, the portion to be bent (associated second chip 21) is first pushed down (or pulled up, depending on the configuration) 90° so that first chip 20 and second chip 21 are approximately perpendicular to each other. The portion associated with first chip 20 or second chip 21 is then pushed toward the other chip until the two chips are contacted via adhesive spacer 26. The two chips are then secured using either heat and/or pressure. The resulting package 100, shown in FIG. 1G, can then be attached to a printed circuit board. As seen from FIG. 1G, package 100 has a thin profile, typically less than or equal to 1.20 mm, and allows chips of approximately the same size to be stacked together.

Figure 2:
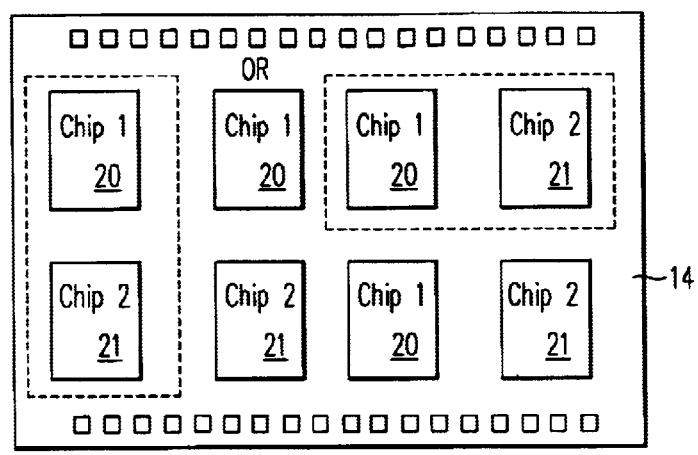
FIG. 2 is a top view of a substrate or tape design for forming multiple two-chip packages.
Figure 3:
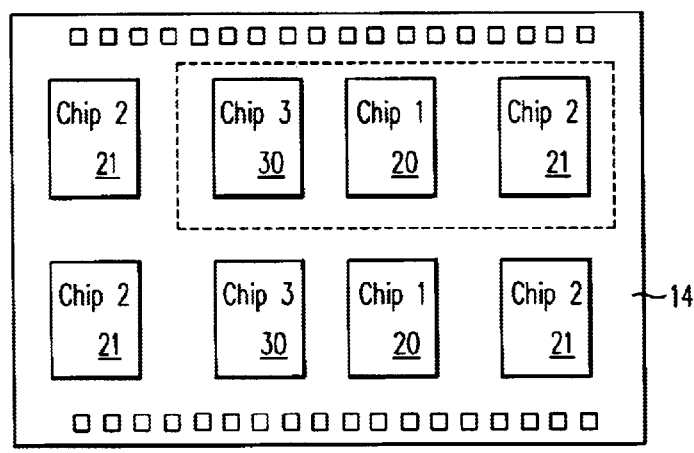
FIG. 3 is a top view of a substrate or tape design for forming multiple three-chip packages.
Figure 4:
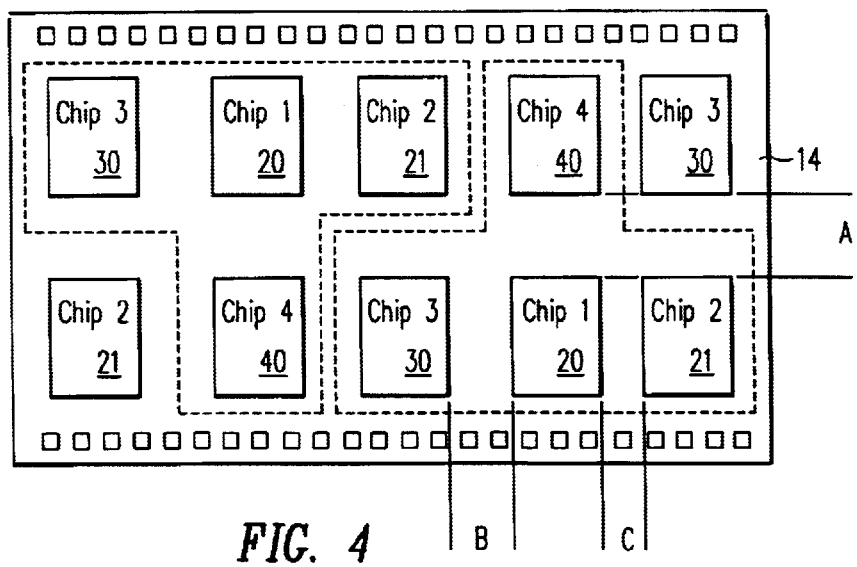
FIG. 4 is a top view of a substrate or tape design for forming multiple four-chip packages.

Multiple packages can be manufactured from a single tape or substrate strip 14, as shown in FIGS. 2–4. FIG. 2 shows a tape design in which multiple two-chip packages can be manufactured. First chip 20 is the chip closest to solder balls 25. Prior to the folding step, each two-chip pair is sawed or cut from the tape. FIG. 3 shows a tape design in which multiple three-chip packages can be manufactured. A third chip 30 will be stacked the furthest from solder balls 25. As shown in FIG. 3, the separation between second chip 21 and third chip 30 is greater than the separation between first chip 20 and second chip 21. After second chip 21 is folded onto first chip 20, third chip 30 is then folded over second chip 21. Thus the separation between first chip 20 and third chip 30 must be sufficient to allow third chip 30 to be folded over both first and second chips 20 and 21. FIG. 4 shows a tape design in which multiple four-chip packages can be manufactured. A fourth chip 40, which is folded over first, second, and third chips 20, 21, and 30, is stacked the furthest from solder balls 25. Thus, the separation A between first chip 20 and fourth chip 40 is the greatest, followed by the separation B between first chip 20 and third chip 30, followed by the separation C between first chip 20 and second chip 21, which has the least amount of separation.

Figure 5:
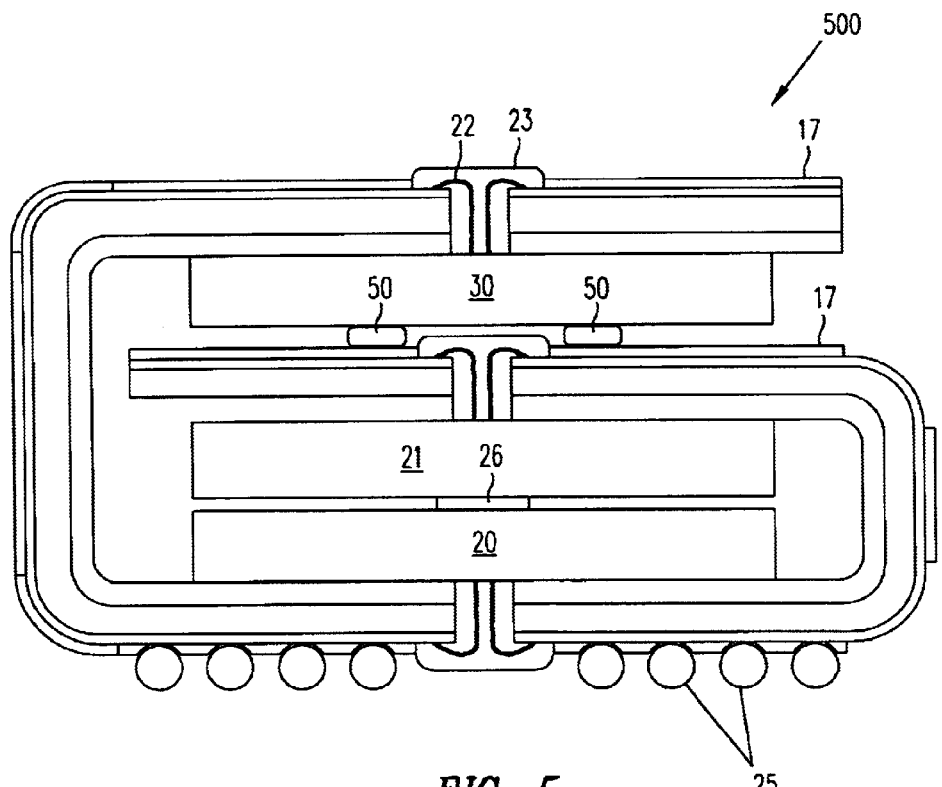
FIG. 5 is a side view of a three-chip package according to one embodiment of the present invention.

FIG. 5 shows a three-chip package 500. When multi-chip packages contain more than two chips, the additional chips are attached from the backside of the chip to insulating layer 17 via adhesive spacers 50. Because the additional third chip 30 is not attached directly to another chip, as is the case for first and second chips 20 and 21, adhesive spacers 50 need to provide sufficient separation between third chip 30 and bond wires 22 and encapsulant 23. This type of method and package structure can be extended to packages having more than three chips, where each additional chip is attached from the backside of the chip to the insulating layer overlying the previous chip.

Figure 6A:
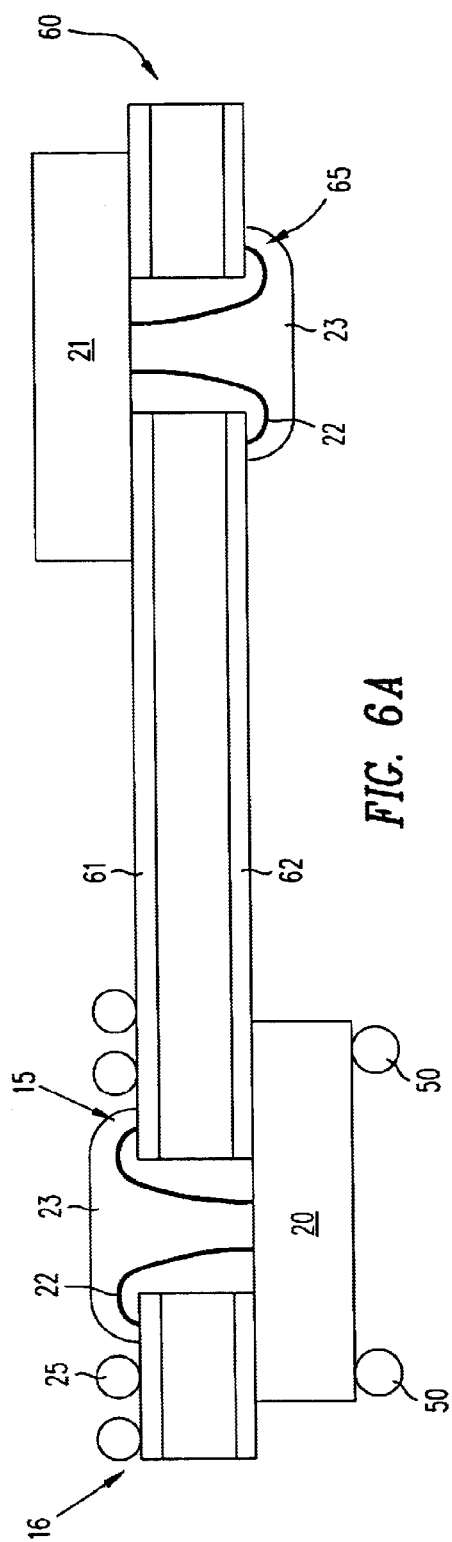
FIG. 6A is a cross-sectional side view of an intermediate step to forming a stacked multiple chip package according to another embodiment of the present invention.
Figure 6B:
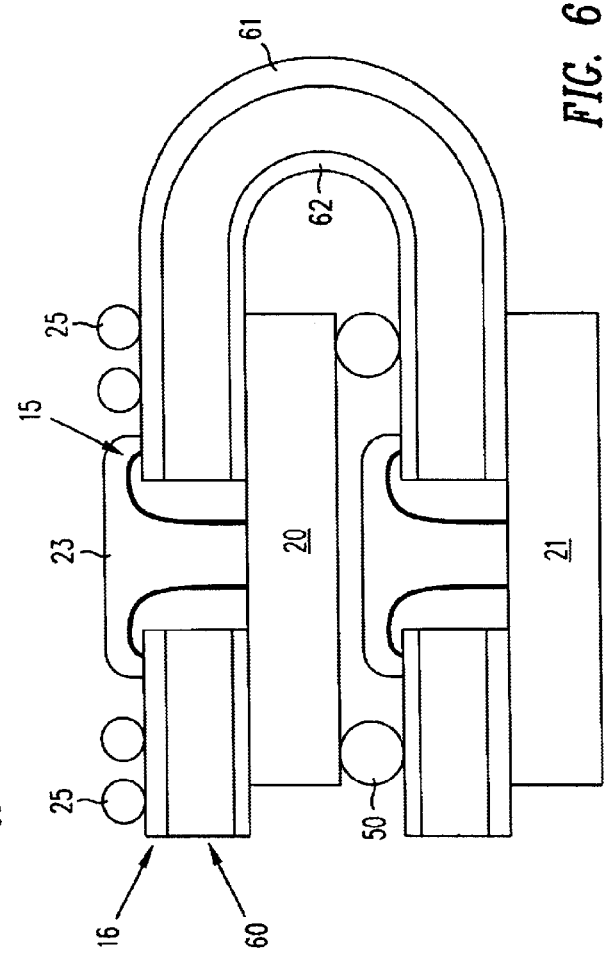
FIG. 6B is a cross-sectional side view of a two-chip package resulting from the step shown in FIG. 6A.

FIGS. 6A and 6B show another embodiment of the present invention in which first chip 20 and second chip 21 are mounted on opposite sides of a substrate 60, instead of on the same sides of a substrate, as shown and discussed above. In FIG. 6A, substrate 60 has metal layers on opposing sides of substrate 60. A first metal layer 61 is opposite first chip 20 and is patterned to form bond fingers 15 and solder ball lands 16 overlying portions of substrate 60 at which first chip 20 is to be attached. An insulating layer (not shown) can be formed on first metal layer 61, except where bond fingers 15 and solder ball lands 16 are located. A second metal layer 62 is opposite second chip 21 and is patterned to form bond fingers 65 overlying portions of substrate at which second chip 21 is to be attached. Another insulating layer (not shown) can also be formed on second metal layer 62, except where bond fingers 65 are located.

First chip 20 is then attached, via an adhesive (not shown), to substrate 60 at a portion opposite bond fingers 15 and solder ball lands 16, and second chip 21 is attached, via an adhesive (not shown), to substrate 60 at a portion opposite bond fingers 65. Bond wires 22 and encapsulant 23 are formed as before to provide the desired connections and protection. Adhesive spacers 50 are attached to either first chip 20 (shown in FIG. 6A) or the portion of substrate 60 opposite second chip 21. Substrate 60 is next bent between first chip 20 and second chip 21 to secure first chip 20 to substrate 60 opposite second chip 21, via adhesive spacers 50. The resulting two-chip package, shown in FIG. 6B, can then be attached to a printed circuit board. This type of package also allows chips of approximately the same size to be stacked together, as with the one shown in FIG. 1G.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A chip package comprising:
   a substrate having an outer first side and an outer second side opposite the first side, wherein the second side includes a metallization layer, but the first side is devoid of metallization;
   a first chip and a second chip each having a first surface with bond pads thereon and an opposite second surface wherein the respective first surfaces of the first card second chips are adhesively coupled to the first side of the substrate, the respective second surfaces of the first and second chips face each other, and the substrate includes at least one bend;
   a plurality of bond wires, wherein some of the bond wires extend through an aperture of the substrate and electrically couple the bond pads of the first chip to the metallization layer of the second side of the substrate, and some of said bond wires extend through an aperture of the substrate and electrically couple the bond pads of the second chip to the metallization layer of the second side of the substrate; and
   an adhesive insulative encapsulant filling the apertures and covering the bond wires.

2. The chip package of claim 1, wherein the first and second chips are the same size.

3. The chip package of claim 1, further comprising an adhesive coupled between the facing second surfaces of the first and second chips.

4. The chip package of claim 1, further comprising metal solder balls electrically coupled to the metallization layer of the second side of the substrate.

5. The chip package of claim 1, further comprising a third chip in a stack with the first and second chips, wherein the third chip has a first surface with bond pads thereon and an opposite second surface, the first surface of the third chip is adhesively coupled to the first side of the substrate, the substrate includes at least two said bends, the second surface of the third chip faces the second side of the substrate, and bond wires extend through an aperture of the substrate and electrically couple the bond pads of the third chip to the metallization layer of the second side of the substrate.

6. The chip package of claim 5, further comprising a spacer adhesively coupled between the second surface of the third chip and the second side of the substrate, said spacer spacing said third chip from the second side of the substrate.

7. The chip package of claim 5, further comprising a fourth chip in the stack with the first, second and third chips, wherein the fourth chip has a first surface with bond pads thereon and an opposite second surface, the first surface of the fourth chip is adhesively coupled to the first side of the substrate, the substrate includes at least three said bends, and bond wires extend through an aperture of the substrate and electrically couple the bond pads of the fourth chip to the metallization layer of the second side of the substrate.

8. The chip package of claim 7, wherein the substrate has a T shape.

9. The chip package of claim 5, wherein plural adhesive spacers straddle the aperture of the substrate through which the bond wires of the closest of the first or second chips extend, said adhesive spacers coupling the second surface of the third chip to the second side of the substrate.

10. The chip package of claim 5, wherein the substrate has a T shape.

11. The chip package of claim 5, wherein the second surface of the third chip is coupled to the second side of the substrate by an adhesive spacer.

12. The chip package of claim 11, wherein the adhesive spacer spaces the second surface of the third chip away from the encapsulant and bond wires of one of the first or second chips.

13. The chip package of claim 12, wherein plural said adhesive spacers straddle the aperture of the substrate through which the bond wires of one of the first or second chips extend.

14. The chip package of claim 1, further comprising a third chip in a stack with the first and second chips, said third chip electrically coupled to the metallization layer of the second side of the substrate.

15. The chip package of claim 1, further comprising a third chip and a fourth chip in a stack with the first and second chips, said third and fourth chips electrically coupled to the metallization layer of the second side of the substrate.

16. A chip package comprising:
   a substrate having an outer first side and an outer second side opposite the first side, wherein the second side includes a metallization layer, but the first side is devoid of metallization;
   a first chip, a second chip, and a third chip in a stacked arrangement, with each having a first surface with bond pads thereon and an opposite second surface, wherein the respective first surfaces of the first, second, and third chips are adhesively coupled to the first side of the substrate, and the substrate includes at least two bends;
   a plurality of bond wires, wherein respective said bond wires extend through the substrate and electrically couple the bond pads of each of the first, second, and third chips to the metallization layer of the second side of the substrate; and
   an adhesive insulative encapsulant covering the bond wires and extending through the substrate.

17. The chip package of claim 16, wherein the respective second surfaces of the first and second semiconductor chips face each other and are adhesively coupled together, and the second surface of the third semiconductor chip faces away from the first and second chips.

18. The chip package of claim 17, further comprising a fourth chip in the stack with the first, second and third chips, wherein the fourth chip has a first surface with bond pads thereon and an opposite second surface, the first surface of the fourth chip is adhesively coupled to the first side of the substrate, bond wires extend through the substrate and electrically couple the bond pads of the fourth chip to the metallization layer of the second side of the substrate, and the substrate includes at least three said bends.

19. The chip package of claim 16, further comprising a fourth chip in the stack with the first, second, and third chips.

* * * * *